US010392691B2

(12) United States Patent
Hou et al.

(10) Patent No.: US 10,392,691 B2
(45) Date of Patent: Aug. 27, 2019

(54) SEMICONDUCTOR SILICON-GERMANIUM THIN FILM PREPARATION METHOD

(71) Applicant: NINGBO CRRC TIMES TRANSDUCER TECHNOLOGY CO., LTD., Ningbo, Zhejiang (CN)

(72) Inventors: Xiaowei Hou, Zhejiang (CN); Junjie Guo, Zhejiang (CN); Dacheng Ni, Zhejiang (CN); Fei Wang, Zhejiang (CN); Huaxiong Zheng, Zhejiang (CN); Liangguang Zheng, Zhejiang (CN); Juping Li, Zhejiang (CN)

(73) Assignee: NINGBO CRRC TIMES TRANSDUCER TECHNOLOGY CO., LTD., Ningbo, Zhejiang (CN)

( * ) Notice: Subject to any disclaimer, the term of this patent is extended or adjusted under 35 U.S.C. 154(b) by 0 days.

(21) Appl. No.: 15/752,590

(22) PCT Filed: Aug. 10, 2016

(86) PCT No.: PCT/CN2016/000439
§ 371 (c)(1),
(2) Date: Feb. 14, 2018

(87) PCT Pub. No.: WO2017/028467
PCT Pub. Date: Feb. 23, 2017

(65) Prior Publication Data
US 2018/0245204 A1  Aug. 30, 2018

(30) Foreign Application Priority Data
Aug. 17, 2015  (CN) .......................... 2015 1 0504862

(51) Int. Cl.
*C23C 14/34*  (2006.01)
*C23C 14/16*  (2006.01)
(Continued)

(52) U.S. Cl.
CPC .......... *C23C 14/165* (2013.01); *C23C 14/022* (2013.01); *C23C 14/34* (2013.01);
(Continued)

(58) Field of Classification Search
CPC ..................................... C23C 14/545
See application file for complete search history.

(56) References Cited

U.S. PATENT DOCUMENTS 4,975,387 A    12/1990  Prokes et al.
2001/0017257 A1*  8/2001  Choi .................. C23C 14/0047
                                                  204/192.22
(Continued)

FOREIGN PATENT DOCUMENTS

CN    101100739 A    1/2008
CN    101108720 A    1/2008
(Continued)

OTHER PUBLICATIONS

International Search Report for PCT/CN2016/000439, dated Nov. 14, 2016, ISA/CN.
(Continued)

*Primary Examiner* — Jason Berman
(74) *Attorney, Agent, or Firm* — Apex Attorneys at Law, LLP; Yue (Robert) Xu

(57) ABSTRACT

A semiconductor silicon-germanium thin film preparation method, comprising the following steps: cleaning a monocrystalline silicon substrate and then disposing the same on a substrate table; respectively sputtering a silicon single thin film and a germanium single thin film; depositing a silicon-germanium alloy thin film having different components on another single crystal silicon substrate using a co-sputtering method, measuring the thickness of the deposited thin film, and obtaining a silicon-germanium alloy thin film having different component ratios.

3 Claims, 2 Drawing Sheets

(51) Int. Cl.
  *C23C 14/54* (2006.01)
  *C23C 14/02* (2006.01)
  *H01L 21/02* (2006.01)

(52) U.S. Cl.
  CPC ...... *C23C 14/545* (2013.01); *H01L 21/02052* (2013.01); *H01L 21/02381* (2013.01); *H01L 21/02532* (2013.01); *H01L 21/02631* (2013.01); *H01L 21/02658* (2013.01)

(56) References Cited

U.S. PATENT DOCUMENTS

| | | | |
|---|---|---|---|
| 2005/0199877 A1 | 9/2005 | Dip et al. | |
| 2006/0090999 A1* | 5/2006 | Hockley | C23C 14/3407 204/192.12 |
| 2006/0249372 A1* | 11/2006 | Xiang | B01J 19/0046 204/192.11 |
| 2008/0017925 A1 | 1/2008 | Yamaguchi et al. | |
| 2012/0193595 A1 | 8/2012 | Cheng et al. | |
| 2014/0246304 A1* | 9/2014 | Debe | C25B 11/04 204/192.15 |

FOREIGN PATENT DOCUMENTS

| | | |
|---|---|---|
| CN | 101880901 B | 5/2012 |
| CN | 102629661 A | 8/2012 |
| CN | 103695855 A | 4/2014 |
| CN | 103972065 A | 8/2014 |
| CN | 104393121 A | 3/2015 |
| CN | 104538542 A | 4/2015 |
| CN | 105088153 A | 11/2015 |

OTHER PUBLICATIONS

Ruijing Ge et al., Nanoindentation of Si1-Xgex Thin Films Prepared by Biased Target Ion Beam Deposition, Conference on Optoelectronic and Microelectronic Materials and Devices, 2014 Conference on. IEEE, Aug. 7, 2015, pp. 210-213.

N. R. Krishnan et al., Control of Chemical Composition of Rare-earth Substituted Iron Garnets using Biased Target Deposition, Conference on Optoelectronic and Microelectronic Materials and Devices, 2012 conference on. IEEE, Dec. 31, 2014, pp. 95-96.

T. L. Hylton et al., Thin Film Processing by Biased Target Ion Beam Deposition, IEEE Transactions on Magnetics, vol. 36, Issue 5, Sep. 30, 2010, pp. 2966-2971.

K. Sasaki et al., Fabrication of Silicon/Germanium superlattice by ion beam sputtering, Vacuum, vol. 66, Dec. 2011, p. 457-462.

E. M. F. Vieira et al., Structural and electrical studies of ultrathin layers with Si0.7Ge0.3 nanocrystals confined in a SiGe/SiO2 superlattice, Journal of Applied Physics, vol. 111, Oct. 2012, p. 104323-1-104323-4.

\* cited by examiner

SEMICONDUCTOR SILICON-GERMANIUM THIN FILM PREPARATION METHOD

FIELD

This is a U.S. National Phase application based upon PCT Application No. PCT/CN2016/000439, filed Aug. 10, 2016 and titled "SEMICONDUCTOR SILICON-GERMANDIUM THIN FILM PREPARATION METHOD", which claims priority to Chinese Patent Application No. 201510504862.2, filed Aug. 17, 2015, the disclosures of which are hereby incorporated by reference in their entirety.

BACKGROUND

Silicon and germanium are two common semiconductor materials used in electron transport devices. As an advanced silicon material, the silicon-germanium alloy thin films consisting of silicon and germanium are more and more widely used. The silicon-germanium alloy thin film materials are mainly used for improving the electron mobility and hole mobility in semiconductor devices, such as Metal Oxide Semiconductor Field Effect Transistor (MOSFET), Modulation Doped Field Effect Transistor (MODFET), Doped Channel Field Effect Transistor (DCFET) and so on. In addition, the silicon-germanium heterostructure can also be used in quantum effect devices, for example Resonant Tunneling Diode (RTD), making it very promising to be the next generation of high-speed silicon device.

There is a great need for applying the silicon-germanium thin film materials in photoelectric micro electro mechanical systems (MEMS), but there are few reports about it. Through controlling the components, some properties of the silicon-germanium alloy thin film can be regulated, such as electrical properties, mechanical properties, optical properties and so on, which are very important for the photoelectric MEMS. In order to make the most advantage of the optical properties of the MEMS, preparing high quality silicon-germanium thin film and learning its mechanical properties become extremely necessary.

The conventional silicon-germanium alloy thin films are usually prepared by methods such as electrodeposition, chemical vapor deposition, magnetron sputtering deposition and ion beam deposition (IBD).

The reference of electrodeposition can be made to Chinese Patent No. CN101880901B titled "Preparation method for silicon-germanium alloy film material" (Authorized Announcement No. ZL201010301123.0).

The reference of chemical vapor deposition can be made to Chinese Patent Application Publication No. CN104393121A titled "Oxygen-doped amorphous silicon-germanium film, heterojunction crystalline silicon solar cell and method thereof" (Application No. 201410581435.X).

Both magnetron sputtering deposition and ion beam deposition have some limitations. It is mainly reflected in erosion track and target poisoning on the surface of the target during magnetron sputtering deposition. In ion beam deposition, the ion beam is sent obliquely, shortening the service life of the target; the escaped ion beam contaminates the chamber material and the silicon-germanium thin film through sputtering deposition; low deposition rate makes it hard to perform deposition on thick silicon-germanium materials.

The photoelectric MEMS requires excellent physical properties of the corresponding semiconductor thin film materials which are influenced by the composition of the materials profoundly. How to adjust the composition of the thin film precisely to obtain thin film with excellent physical properties is a key technique in semiconductor thin film deposition technique.

Reference 1 "Fabrication of Silicon/Germanium superlattice by ion beam sputtering, Vacuum, Vol. 66, December 2002, P457-462", discloses a method to form semiconductor silicon-germanium thin film on the silicon substrate by ion beam deposition, wherein two layers of silicon and germanium thin film with a total thickness of 300 nm is deposited and the roughness of the thin film is 1.08 nm shown in atomic force microscope 3D image.

Reference 2 "Structural and electrical studies of ultrathin layers with $Si_{0.7}Ge_{0.3}$ nanocrystals confined in a $SiGe/SiO_2$ superlattice, Journal of Applied Physics, Vol. 111, October 2012, P. 104323-1-104323-4" discloses a method for preparing silicon-germanium thin film by radio frequency magnetron sputtering deposition. The method can prepare relative thin silicon-germanium thin film by co-sputtering method, obtaining relative fine structure and good electrical properties. However, the method cannot control the composition of the thin film precisely, and utilization ratio of the target is low, which shorten the service life of the target and is not conducive to wide application.

Circular magnetic field is used in magnetron sputtering deposition, which forces the secondary electrons hurdle along the circular magnetic field. Correspondingly, the area controlled by the circular magnetic field is the area with the highest plasma density, which causes a circular groove on the target, i.e. erosion track. Once the groove penetrates the target, the whole target is destroyed, leading to low utilization of the target. In addition, due to the instability of the plasma used in the magnetic sputtering deposition, uneven etchings are formed on the surface of the target, causing target poisoning, which inevitably leads to the doping of films in the target poisoning area, decreasing the purity of the thin film.

In ion beam deposition process, the ion beam is sent obliquely, which leads to uneven etchings on the entire target, shortening the service life of the target. Some ion beams can escape and sputter on the vacuum chamber materials, leading to the generation of impurity ions which can contaminate the silicon-germanium thin film. The target area of the ion beams is quite small, resulting in low deposition rate, which makes it hard to perform deposition on relative thick silicon-germanium thin films.

SUMMARY

The technical problem to be solved by the present disclosure is to provide a method for preparing semiconductor silicon-germanium thin film by biased target ion beam deposition to overcome the limitations of prior art.

Another technical problem to be solved by the present disclosure is to provide a method for preparing a semiconductor silicon-germanium thin film with long service life.

Another technical problem to be solved by the present disclosure is to provide a method for preparing a semiconductor silicon-germanium thin film with increased purity.

The technical solution to solve the technical problems above in the present disclosure is a method for preparing a semiconductor silicon-germanium thin film, comprising the following steps:

(1) cleaning a mono-crystalline silicon substrate by ultrasound in acetone for 5 min to 10 min; cleaning the substrate by ultrasound in methanol for 5 min to 10 min; cleaning the substrate by ultrasound in isopropanol for 5 min to 10 min;

washing repeatedly with deionized water; drying and placing the mono-crystalline silicon substrate on a platform;

(2) vacuumizing a vacuum chamber of a deposition system to $8\times10^{-8}$ Torr to $9\times10^{-8}$ Torr; maintaining the chamber temperature between 20° C. and 30° C.; maintaining the pressure of the vacuum chamber between $8\times10^{-8}$ Torr and $9\times10^{-8}$ Torr;

(3) sputtering a single thin film of silicon on the mono-crystalline silicon substrate under conditions: sputtering pressure from $4\times10^{-4}$ Torr to $5\times10^{-4}$ Torr, bias voltage of the cathode from 600V to 700V, argon as the sputtering gas, gas flow rate from 30 sccm to 50 sccm, sputtering duration from 30 min to 50 min; measuring the thickness of the deposited film and calculating the deposition rate of the silicon thin film under the current parameters;

(4) sputtering a single thin film of germanium on another mono-crystalline silicon substrate under conditions: sputtering pressure from $4\times10^{-4}$ Torr to $5\times10^{-4}$ Torr, bias voltage of the cathode from 600V to 700V, argon as the sputtering gas, gas flow rate from 30 sccm to 50 sccm, sputtering duration from 30 min to 50 min; measuring the thickness of the deposited film and calculating the deposition rate of the germanium thin film under the current parameters;

(5) performing co-sputtering to deposit a silicon-germanium alloy thin film with different compositions on another mono-crystalline silicon substrate under conditions: sputtering pressure from $4\times10^{-4}$ Torr to $5\times10^{-4}$ Torr, bias voltage of the cathode from 600V to 700V, argon as the sputtering gas, gas flow rate from 30 sccm to 50 sccm, sputtering duration from 30 min to 50 min; measuring the thickness of the deposited film; obtaining a silicon-germanium alloy thin film with different compositions; and in above steps (3), (4) and (5), the sputtering pressure, bias voltage of the negative electrode, gas flow rate and sputtering duration are the same.

Preferably, the mass rate of silicon and germanium in the silicon-germanium alloy thin film is from 3:4 to 2:5.

Preferably, the thickness of the silicon-germanium alloy thin film is from 64 nm to 280 nm.

Compared with the conventional art, the present disclosure has advantages as follows: biased target ion beam deposition is used, which combines the advantages of ion beam deposition and magnetron sputtering deposition, overcoming the disadvantages of magnetron sputtering deposition and ion beam deposition efficiently, making it very suitable for the preparation of semiconductor thin films such as silicon and germanium thin films. The details are as follows:

In biased target ion deposition, the plasma is controlled by applying bias voltage on the target, which avoids the formation of erosion track and uneven etching and prolongs the service life of the target.

In biased target ion deposition, plasma source with low energy is used, which has stable properties, avoiding the uneven etchings on the surface of the target and target poisoning, effectively increasing the purity of the thin film.

As the energy of plasma emitted in biased target ion beam deposition process is pretty low, the escaped ion beam will not sputter in the vacuum chamber, improving the purity of the thin film.

In biased target ion beam deposition, plasma sheath is installed near the target, which increases the speed of the positive ions when entering the sheath, therefore ensuring that the bombarding area of the ion beam is larger than the area of the target. In addition, by regulating the voltage, the deposition rate can be manipulated to reach a relative high deposition rate, which makes the deposition on relative thick thin film materials possible.

In biased target ion beam deposition, by choosing suitable voltage and with the help of the effect of the voltage on the sputtering energy, the atoms mixing on the thin film interface and the entire roughness of the thin film are regulated efficiently.

By controlling the bias voltage and deposition duration, silicon-germanium alloy thin films with different compositions are prepared on the silicon substrates. Compared with the thin films in prior art, the roughness of the silicon-germanium alloy thin film decreases from 1.08 nm to 0.46 nm.

DETAILED DESCRIPTION

The present disclosure will be further described in conjunction with the figures.

Example 1

(1) A mono-crystalline silicon substrate is cleaned by ultrasound in acetone for 10 min; the substrate is cleaned by ultrasound in methanol for 10 min; the substrate is cleaned by ultrasound in isopropanol for 10 min; the substrate is washed repeatedly with deionized water; and the mono-crystalline silicon substrate is dried and placed on a platform.

(2) The vacuum chamber of deposition system is vacuumizied to $9\times10^{-8}$ Torr; the chamber temperature is maintained at 25° C.; and the pressure of vacuum chamber is maintained at $9\times10^{-8}$ Torr.

(3) A single thin film of silicon is sputtered on the mono-crystalline silicon substrate under conditions: $5\times10^{-4}$ Torr of sputtering pressure, 600V of bias voltage of the cathode, argon as the sputtering gas, 40 sccm of gas flow rate, 30 min of sputtering duration. The thickness of the deposited film is measured, which is 24 nm; and the deposition rate of the silicon thin film is calculated under the current parameters, which is 0.8 nm/min.

(4) A single thin film of germanium is sputtered on another mono-crystalline silicon substrate under conditions: $5\times10^{-4}$ Torr of sputtering pressure, 600V of bias voltage of the cathode, argon as the sputtering gas, 40 sccm of gas flow rate, 30 min of sputtering duration. The thickness of the deposited film is measured, which is 60 nm; and the deposition rate of the silicon thin film is calculated under the current parameters, which is 2 nm/min.

(5) Co-sputtering is performed to deposit a silicon-germanium alloy thin film with different compositions on another mono-crystalline silicon substrate under conditions: $5\times10^{-4}$ Torr of sputtering pressure, 600V of bias voltage of the cathode, argon as the sputtering gas, 40 sccm of gas flow rate, 30 min of sputtering duration. The thickness of the deposited film is measured, which is 84 nm; and the mass rate of silicon and germanium in the final alloy thin film is 2:5.

Figure 1:
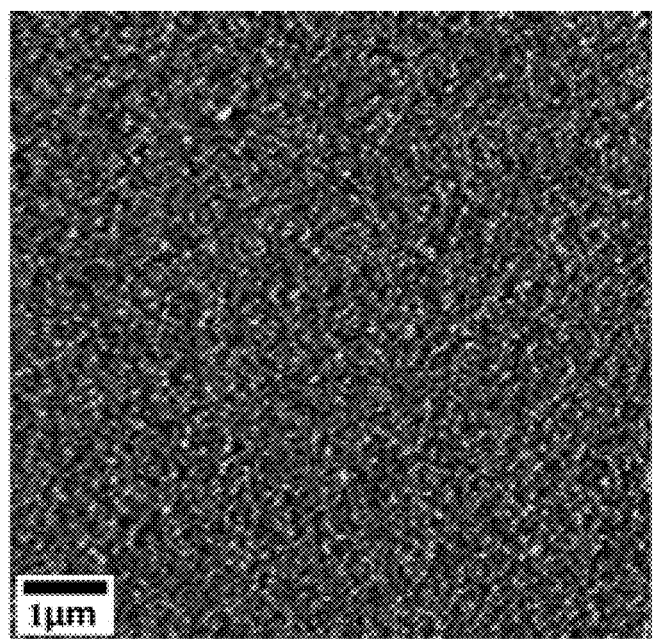
FIG. 1 is the 2D micrograph of the surface of the silicon-germanium alloy thin film obtained in Example 1 under atomic force microscope.
Figure 2:
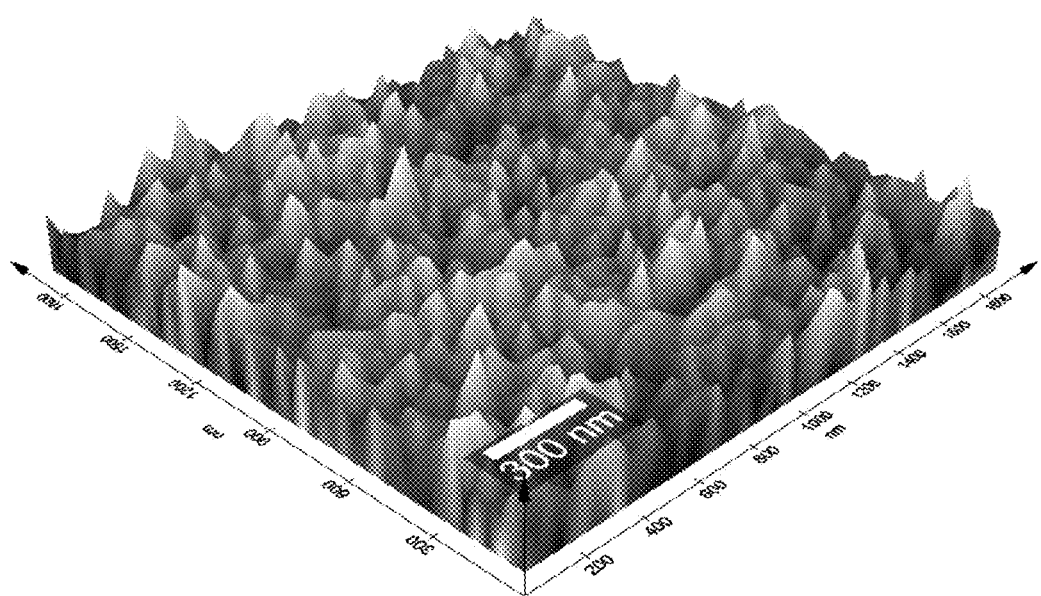
FIG. 2 is the 3D morphology image of the surface of the silicon-germanium alloy thin film obtained in Example 1 under atomic force microscope.

As shown in FIG. 1 and FIG. 2, the silicon-germanium alloy thin film prepared in Example 1 is measured by atomic force microscope and the root mean square roughness is 0.46 nm.

Example 2

(1) A mono-crystalline silicon substrate is cleaned by ultrasound in acetone for 8 min; the substrate is cleaned by ultrasound in methanol for 8 min; the substrate is cleaned by ultrasound in isopropanol for 8 min; the substrate is washed repeatedly with deionized water; and the mono-crystalline silicon substrate is dried and placed on a platform.

(2) The vacuum chamber of deposition system is vacuumizied to $8 \times 10^{-8}$ Torr; the chamber temperature is maintained at 25° C.; and the pressure of vacuum chamber is maintained at $8 \times 10^{-8}$ Torr.

(3) A single thin film of silicon is sputtered on the mono-crystalline silicon substrate under conditions: $4 \times 10^{-4}$ Torr of sputtering pressure, 700 V of bias voltage of the cathode, argon as the sputtering gas, 40 sccm of gas flow rate, 40 min of sputtering duration. The thickness of the deposited film is measured, which is 64 nm; and the deposition rate of the silicon thin film is calculated under the current parameters, which is 1.6 nm/min.

(4) A single thin film of germanium is sputtered on another mono-crystalline silicon substrate under conditions: $4 \times 10^{-4}$ Torr of sputtering pressure, 700V of bias voltage of the cathode, argon as the sputtering gas, 40 sccm of gas flow rate, 40 min of sputtering duration. The thickness of the deposited film is measured, which is 128 nm; and the deposition rate of the silicon thin film is calculated under the current parameters, which is 3.2 nm/min.

(5) Co-sputtering is performed to deposit a silicon-germanium alloy thin film with different compositions on another mono-crystalline silicon substrate under conditions: $4 \times 10^{-4}$ Torr of sputtering pressure, 700V of bias voltage of the cathode, argon as the sputtering gas, 40 sccm of gas flow rate, 40 min of sputtering duration. The thickness of the deposited film is measured, which is 192 nm; and the mass rate of silicon and germanium in the final alloy thin film is 2:3.

Example 3

(1) A mono-crystalline silicon substrate is cleaned by ultrasound in acetone for 5 min; the substrate is cleaned by ultrasound in methanol for 5 min; the substrate is cleaned by ultrasound in isopropanol for 5 min; the substrate is washed repeatedly with deionized water; and the mono-crystalline silicon substrate is dried and placed on a platform.

(2) The vacuum chamber of deposition system is vacuumizied to $8 \times 10^{-8}$ Torr; the chamber temperature is maintained at 25° C.; and the pressure of vacuum chamber is maintained at $8 \times 10^{-8}$ Torr.

(3) A single thin film of silicon is sputtered on the mono-crystalline silicon substrate under conditions: $4 \times 10^{-4}$ Torr of sputtering pressure, 700V of bias voltage of the cathode, argon as the sputtering gas, 40 sccm of gas flow rate, 50 min of sputtering duration. The thickness of the deposited film is measured, which is 120 nm; and the deposition rate of the silicon thin film is calculated under the current parameters, which is 2.4 nm/min.

(4) A single thin film of germanium is sputtered on another mono-crystalline silicon substrate under conditions: $4 \times 10^{-4}$ Torr of sputtering pressure, 700V of bias voltage of the cathode, argon as the sputtering gas, 40 sccm of gas flow rate, 50 min of sputtering duration. The thickness of the deposited film is measured, which is 160 nm; and the deposition rate of the silicon thin film is calculated under the current parameters, which is 3.2 nm/min.

(5) Co-sputtering is performed to deposit a silicon-germanium alloy thin film with different compositions on another mono-crystalline silicon substrate under conditions: $4 \times 10^{-4}$ Torr of sputtering pressure, 700V of bias voltage of the cathode, argon as the sputtering gas, 40 sccm of gas flow rate, 50 min of sputtering duration. The thickness of the deposited film is measured, which is 280 nm; and the mass rate of silicon and germanium in the final alloy thin film is 3:4.

It can be concluded from the above examples:

(1) In magnetron sputtering deposition, circular magnetic field is used to control the plasma, which causes erosion track, leading to low utilization of the target. In ion beam deposition, the ion beam is sent obliquely, which gives uneven etches on the targets, also leading to low utilization of the target. Therefore, both magnetron sputtering deposition and ion beam deposition shorten the service life of the target. In comparison, in biased target ion beam deposition, negative bias voltage is applied to the target to control the plasma, which does not form erosion track and uneven etches, prolonging the service life of the target efficiently.

(2) In magnetron sputtering deposition, due to the instability of the plasma, uneven etchings are formed on the surface of target, causing target poisoning, which inevitably leads to the doping of films in the target poisoning area, decreasing the purity of the thin film. While in biased target ion beam deposition, plasma source with low energy is used, which has stable properties, avoiding the uneven etches on the surface of the target and target poisoning, effectively increasing the purity of the thin film.

(3) In ion beam deposition, some ion beams can escape and sputter on the vacuum chamber materials, leading to the generation of impurity ions which can contaminate the silicon-germanium thin film. While the energy of plasma emitted in biased target ion beam deposition is pretty low, the escaped ion beam will not sputter on the vacuum chamber, improving the purity of the thin film.

(4) As the target area of the ion beams is too small, resulting in low deposition rate, which makes it difficult to perform deposition on thick silicon-germanium thin film. While in biased target ion beam deposition, plasma sheath is installed near the target, which increases the speed of the positive ions when entering the sheath, therefore ensuring that the bombarding area of the ion beam is larger than the area of the target. In addition, by regulating the voltage, the deposition rate can be regulated to reach a relative high deposition rate, which makes the deposition on relative thick thin film materials possible.

(5) In biased target ion beam deposition, by choosing suitable voltage and with the help of the effect of the voltage on the sputtering energy, the atoms mixing on the thin film interface and the entire roughness of the thin film are regulated efficiently.

In view of the above, biased target ion beam deposition can effectively overcome the disadvantages of magnetron sputtering deposition and ion beam deposition during preparing semiconductor thin films such as silicon-germanium alloy thin film and so on. By regulating the bias voltage and deposition duration, silicon-germanium alloy thin films with different compositions are prepared on the silicon substrate. Compared with the thin film in conventional art, the roughness of the silicon-germanium alloy thin film prepared in the present disclosure decreases form 1.08 nm to 0.46 nm, which is very important to the development of photoelectric MEMS.

What is claimed is:

1. A method for preparing a semiconductor silicon-germanium thin film, comprising the following steps:
   (1) cleaning a mono-crystalline silicon substrate by ultrasound in acetone for 5 min to 10 min; cleaning the substrate by ultrasound in methanol for 5 min to 10 min; cleaning the substrate by ultrasound in isopropanol for 5 min to 10 min; washing the mono-crystalline silicon substrate repeatedly with deionized water; drying and placing the mono-crystalline silicon substrate on a platform;
   (2) vacuumizing a vacuum chamber of a deposition system to between $8\times10^{-8}$ Torr and $9\times10^{-8}$ Torr; maintaining the chamber temperature between 20° C. and 30° C.; maintaining the pressure of the vacuum chamber between $8\times10^{-8}$ Torr and $9\times10^{-8}$ Torr; and
   (3) performing co-sputtering to deposit a silicon-germanium alloy thin film on a mono-crystalline silicon substrate under conditions: sputtering pressure from $4\times10^{-4}$ Torr to $5\times10^{-4}$ Torr, bias voltage on a target from 600V to 700V, argon as the sputtering gas, gas flow rate from 30 sccm to 50 sccm, sputtering duration from 30 min to 50 min; and obtaining silicon-germanium alloy thin film.

2. The method for preparing the semiconductor silicon-germanium thin film according to claim 1, wherein the mass rate of silicon and germanium in the silicon-germanium alloy thin film is from 3:4 to 2:5.

3. The method for preparing the semiconductor silicon-germanium thin film according to claim 1, wherein the thickness of the silicon-germanium alloy thin film is from 64 nm to 280 nm.

* * * * *